United States Patent
Xie et al.

(10) Patent No.: US 10,942,809 B2
(45) Date of Patent: Mar. 9, 2021

(54) CHANGING OF ERROR CORRECTION CODES BASED ON THE WEAR OF A MEMORY SUB-SYSTEM

(71) Applicant: Micron Technology, Inc., Boise, ID (US)

(72) Inventors: Tingjun Xie, Milpitas, CA (US); Ying Yu Tai, Mountain View, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 16/228,632

(22) Filed: Dec. 20, 2018

(65) Prior Publication Data

US 2020/0201713 A1 Jun. 25, 2020

(51) Int. Cl.
| | | |
|---|---|---|
| *G06F 11/00* | (2006.01) | |
| *G06F 11/10* | (2006.01) | |
| *G06F 3/06* | (2006.01) | |

(52) U.S. Cl.
CPC ........ *G06F 11/1096* (2013.01); *G06F 3/0614* (2013.01); *G06F 3/0629* (2013.01); *G06F 3/0673* (2013.01)

(58) Field of Classification Search
CPC .. G06F 11/1096; G06F 3/0614; G06F 3/0629; G06F 3/0673
See application file for complete search history.

(56) References Cited

U.S. PATENT DOCUMENTS

| | | | | |
|---|---|---|---|---|
| 5,367,383 | A * | 11/1994 | Godshalk | H04N 1/41 358/404 |
| 5,671,239 | A * | 9/1997 | Higashitani | G06F 11/1008 714/805 |
| 7,546,561 | B2 * | 6/2009 | Pouarz | G01R 31/318544 703/14 |
| 8,055,987 | B2 * | 11/2011 | Jeong | H03M 13/118 714/801 |
| 8,559,539 | B2 * | 10/2013 | Kim | H04L 1/0084 375/265 |
| 8,621,333 | B2 * | 12/2013 | Lee | H03M 13/6368 714/790 |
| 8,874,994 | B2 * | 10/2014 | Sharon | G11C 11/5628 714/766 |
| 8,880,977 | B2 * | 11/2014 | Sharon | G06F 11/1044 714/763 |
| 9,762,262 | B2 * | 9/2017 | Ashikhmin | H03M 13/6362 |
| 10,340,948 | B2 * | 7/2019 | Sugihara | H03M 13/6362 |

(Continued)

OTHER PUBLICATIONS

PCT International Search Report and Written Opinion for International Application No. PCT/US2019/068075, dated Apr. 22, 2020, 12 pages.

(Continued)

*Primary Examiner* — Esaw T Abraham
(74) *Attorney, Agent, or Firm* — Lowenstein Sandler LLP (57) ABSTRACT

Data to be stored at a memory sub-system can be received. A usage characteristic of the memory sub-system can be determined. The received data can be encoded to generate a codeword with a number of parity bits. A portion of the number of parity bits of the generated codeword can be removed based on the usage characteristic of the memory sub-system. Furthermore, the codeword can be stored without the removed portion of the number of parity bits.

20 Claims, 9 Drawing Sheets (56) References Cited

U.S. PATENT DOCUMENTS

2009/0144598 A1   6/2009   Yoon et al.
2013/0086454 A1   4/2013   Rub
2015/0077277 A1   3/2015   Alhussien et al.
2015/0363262 A1   12/2015  Hu et al.
2018/0024877 A1   1/2018   Gold et al.

OTHER PUBLICATIONS

Wang et al., "A Novel Puncturing Scheme for Polar Codes," IEEE Communications Letters, vol. 18, No. 12, Dec. 2014, 4 pages.
Niu et al., "Beyond Turbo Codes: Rate-Compatible Punctured Polar Codes," IEEE Communications Theory, 2013, 5 pages.
Zhang et al., "Parity-Check Polar Coding for 5G and Beyond," arXiv:1801.03616 [cs.IT], Jan. 11, 2018, 7 pages.

\* cited by examiner

CHANGING OF ERROR CORRECTION CODES BASED ON THE WEAR OF A MEMORY SUB-SYSTEM

TECHNICAL FIELD

The present disclosure generally relates to a memory sub-system, and more specifically, relates to the changing of error correction codes based on the wear of memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to changing error correction codes based on the wear of memory sub-systems. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A conventional memory sub-system can implement an error detection and correction (i.e., an error control) operation for the data that is stored at and/or retrieved from the memory components of the memory sub-system. The error control operation can utilize an error correcting code (ECC) to encode host data and store the encoded host data at the memory sub-system. For example, the host data can be encoded to generate a codeword and the codeword can be stored at the memory sub-system. Subsequently, when the host system requests the host data, the codeword can be decoded to generate the host data. The encoding and decoding of the error control operation can be used to detect any errors that may have been caused by noise or other such impairments that can cause a value or bit of the host data to switch (e.g., from a '0' value to a '1' value or vice versa) when the host data is stored or read. The detected error can subsequently be corrected based on the error control operation.

The error correcting code utilized by the error control operation of the conventional memory sub-system can be designed based on a worst case scenario for data stored at the conventional memory sub-system. For example, as the use or wear of the conventional memory sub-system increases, the rate of errors being present at the stored data can be expected to increase. The error correcting code can thus be designed based on the highest rate of errors (being present at the stored data) that can occur when the conventional memory sub-system is at the end of operating life or has a maximum amount of wear. Such an error correcting code can result in a fixed amount of parity bits for each segment of data that is to be encoded and stored. The number of the parity bits that are used can result in more bit errors of the data being detected and corrected. Since the rate of errors of the memory sub-system at the beginning of the operating life is expected to be less than the rate of errors at the end of the operating life of the memory sub-system, then the fixed amount of parity bits being used when encoding the data can be excessive for use during the beginning of the operating life of the conventional memory sub-system.

Aspects of the present disclosure address the above and other deficiencies by changing an error correction code based on the usage or wear of a memory sub-system. For example, a code rate or the number of parity bits that are included in the codeword can be changed over the operating life of the memory sub-system. For example, the code rate or the number of parity bits included in a codeword for host data that is to be encoded can be increased over time as the wear or usage of the memory sub-system increases and the rate of errors can be expected to increase.

In some embodiments, a polar encoder and a polar decoder can be used for the error control operation that utilizes the error correction code that changes based on the wear of the memory sub-system. For example, host data can be encoded by the polar encoder at a particular point in the operating life of the memory sub-system. The resulting codeword can include a number of parity bits and a portion of the parity bits of the resulting codeword can be stored. At a subsequent point in the operating life of the memory sub-system, subsequent host data can be received and the same polar encoder can be used to generate another codeword with the same number of parity bits, and an increased portion of the parity bits of the other codeword can then be stored at the memory sub-system. Thus, the same polar encoder can be used to generate the codeword with a fixed number of parity bits and portions of the fixed number of parity bits can be stored based on the wear of the memory sub-system. As the wear of the memory sub-system increases, the number of the parity bits that are stored with the codeword can be increased. Furthermore, the polar decoder can be used to decode codewords to generate the resulting host data. In some embodiments, certain parity bits can be reconstructed before the codeword is decided by the polar decoder as described in further detail below.

Advantages of the present disclosure include, but are not limited to, an increased utilization of the memory sub-system to store host data. For example, more host data can be stored at the memory sub-system at the beginning of the operating life as the size of parity data can be smaller than when the memory sub-system is at the end of the operating life. Furthermore, because less parity data can be written over the operating life of the memory sub-system since the number of parity bits that are stored gradually increases as the memory sub-system wears as opposed to being fixed at a large number of parity bits, the endurance of the memory sub-system can also be increased. For example, the rate of wear of the memory sub-system can be considered to be decreased as less parity data is written to memory components over the operating lifetime of the memory sub-system.

Figure 1:
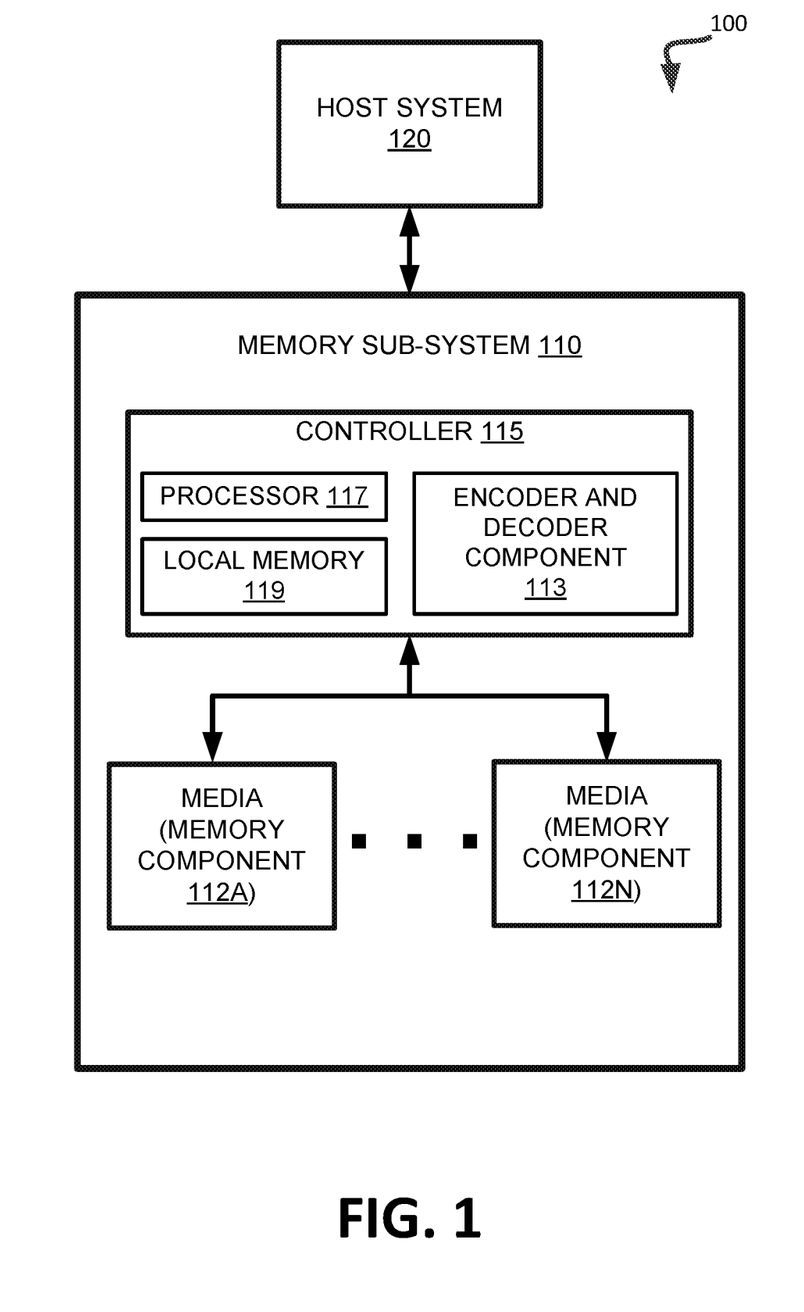
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an encoder and decoder component 113 that can be used to encode host data to generate codewords that are to be stored at the memory components 112A to 112N and to decode the codewords to generate host data. In some embodiments, the controller 115 includes at least a portion of the encoder and decoder component 113. For example, the controller 115 can include a processor 117 (processing device) configured to execute instructions stored in local memory 119 for performing the operations described herein. In some embodiments, the encoder and decoder component 113 is part of the host system 120, an application, or an operating system.

The encoder and decoder component 113 can receive host data and an indication of the wear or usage of the memory sub-system 110. The host data can be encoded based on the indicated wear or usage of the memory sub-system. For example, a number of parity bits of the codeword can be stored based on the wear or usage of the memory sub-system 110. Further details with regards to the operations of the encoder and decoder component 113 are described below.

Figure 2A:
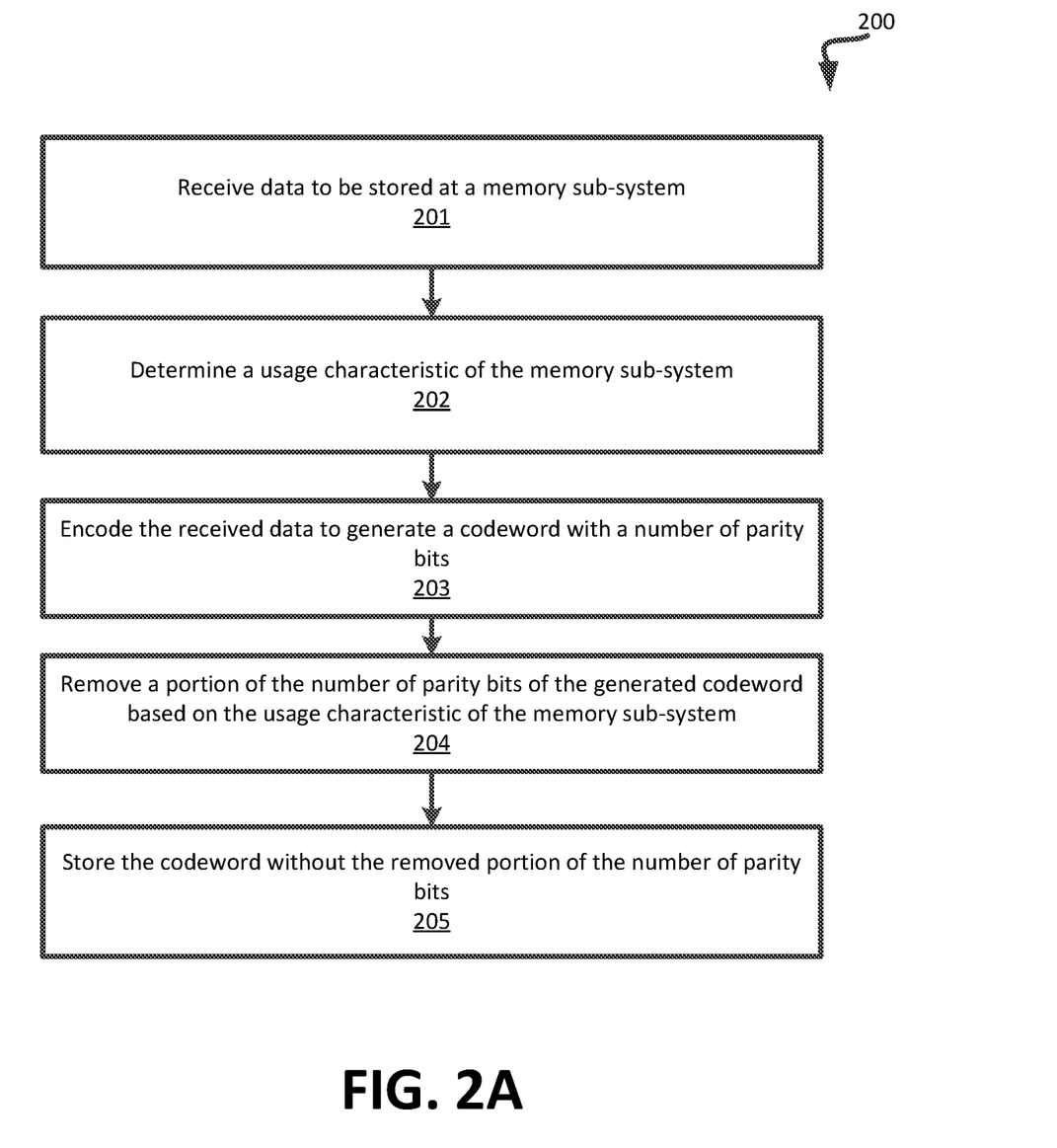
FIG. 2A is a flow diagram of an example method to store a codeword with a number of parity bits based on usage or wear characteristic of a memory sub-system in accordance with some embodiments.

FIG. 2A is a flow diagram of an example method 200 to store a codeword with a number of parity bits based on usage or wear characteristic of a memory sub-system in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the encoder and decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2A, at operation 201, the processing logic receives data to be stored at a memory sub-system. For example, a host system can provide host data to be stored at the memory sub-system. At operation 202, the processing logic determines a usage characteristic of the memory sub-system. The usage characteristic can be based on a write count of the memory sub-system where the write count indicates a number of write operations that have been performed by the memory sub-system. In some embodiments, the usage characteristic can indicate an average bit error rate for data that has been recently read from the memory sub-system or a retry rate for error correction for the data that has been recently read from the memory sub-system. The retry rate can identify a number of error correction cycles that have been performed when an error correction operation has failed. The usage characteristic can be any indication of the operating lifetime of the memory sub-system. Further details of the usage characteristic are described in conjunction with FIG. 2B. In some embodiments, the usage characteristic can indicate an operating condition of the memory sub-system. For example, the usage characteristic can indicate a current operating temperature or other environmental condition of the memory sub-system.

At operation 203, the processing logic encodes the received data to generate a codeword with a number of parity bits. For example, a polar encoder can be used to generate the codeword with a defined number of parity bits as described in further detail below with respect to FIG. 2B. At operation 204, the processing logic removes a portion of the number of parity bits of the generated codeword based on the usage characteristic of the memory sub-system. For example, a particular number of parity bits can be removed from the generated codeword based on the usage characteristic of the memory sub-system. As described in further detail below, as the usage or wear of the memory sub-system increases, fewer parity bits can be removed from the generated codeword. Thus, as the wear or usage of the memory sub-system increases, the codeword can be stored with more parity bits. At operation 205, the processing logic stores the codeword without the removed portion of the number of parity bits. Thus, the number of parity bits that are stored with the codeword can be based on the usage or wear of the memory sub-system. As the usage or the wear of the memory sub-system changes, the number of parity bits that are stored with the codeword can also change.

Figure 2B:
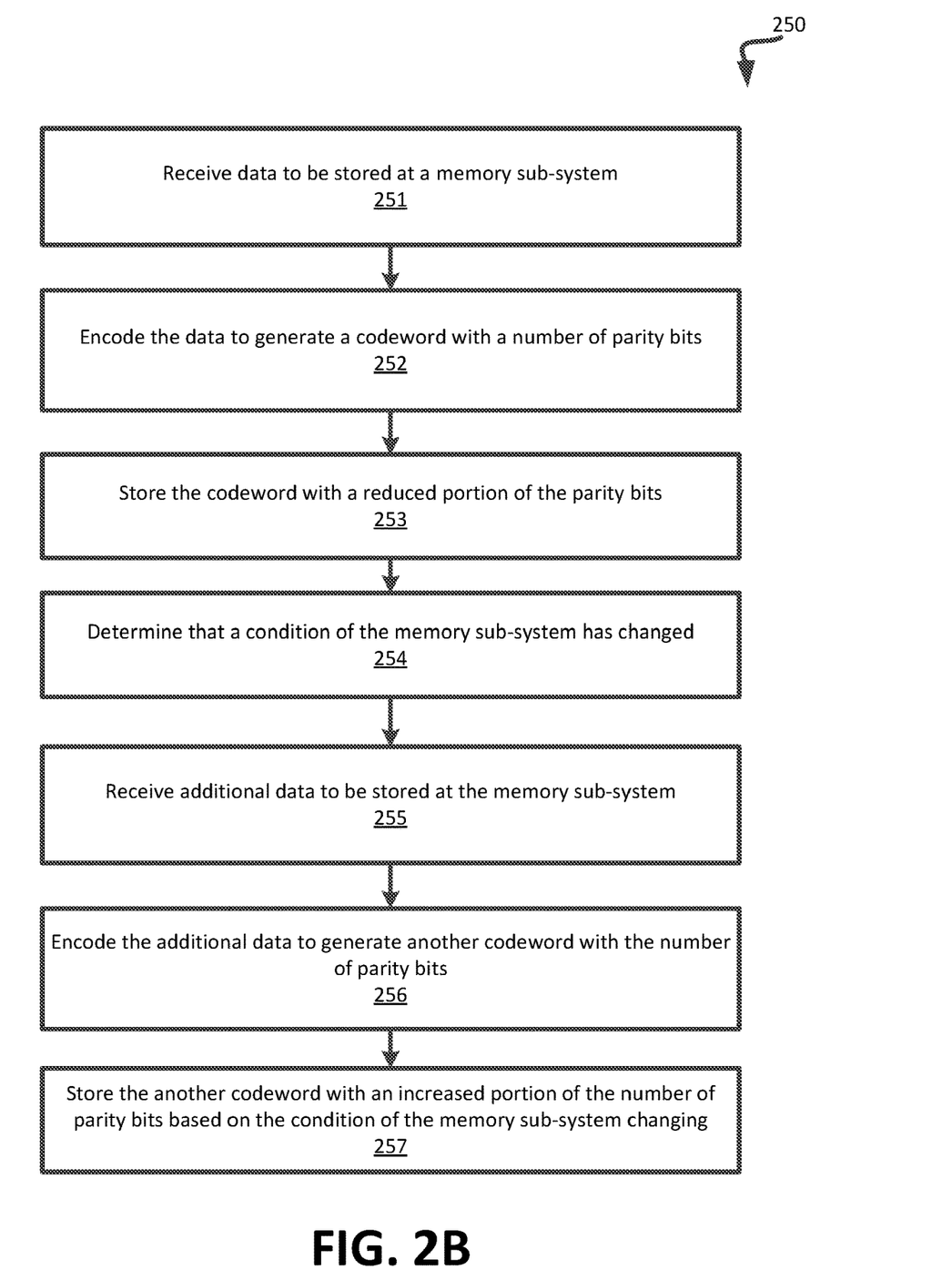
FIG. 2B is a flow diagram of an example method to store a codeword with a number of parity bits based on a change of a condition of a memory sub-system in accordance with some embodiments.

FIG. 2B is a flow diagram of an example method 250 to store a codeword with a number of parity bits based on a change of a condition of a memory sub-system in accordance with some embodiments of the present disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 250 is performed by the encoder and decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2B, at operation 251, the processing logic receives data to be stored at a memory sub-system. For example, a host system can provide data (i.e., host data) that is to be stored at the memory sub-system. At operation 252, the processing logic encodes the data to generate a codeword with a number of parity bits. For example, an encoding operation can be performed on the data to generate the codeword with the number of parity bits. The encoding operation can be a linear transformation of the data. For example, the encoding operation can be performed on the data at a particular number of bits and can perform a linear transformation of the data to generate a codeword at an increased number of bits. An example of such an encoding operation includes, but is not limited to, a polar code or polar encoding operation. A polar code can be a linear block error correcting code that applies a matrix to the data to transform the data into the codeword. The parity bits of the codeword can be additional bits that are used to detect and correct any errors when the codeword is later retrieved. In some embodiments, the parity bits can be based on or calculated by values of the bits of the data that is to be encoded. As such, the codeword can include the encoded data and the parity bits for the data.

At operation 253, the processing logic stores the codeword with a reduced portion of the parity bits. For example, a subset (i.e., a proper subset) of the parity bits that were generated as part of the codeword can be stored. Thus, the portion of the codeword that corresponds to the encoded data and a portion of the parity bits can be stored at the memory sub-system. In some embodiments, the portion of the parity bits can be selected based on a usage or wear characteristic or a condition of the memory sub-system. The selection of the parity bits that are to be stored can performed by puncturing which refers to the removal of certain parity bits after encoding with an error-correction code (e.g., the polar code).

The parity bits can be punctured or removed based on the characteristic or condition of the memory sub-system. The characteristic can indicate a wear or usage of the operating life of the memory sub-system. For example, the wear can be a number of total write operations that have been performed at the memory sub-system. In some embodiments, the characteristic can indicate an average bit error rate for data that has recently been read from the memory sub-system. In the same or alternative embodiments, the characteristic can indicate a retry rate for error correction for the data that has recently been read from the memory sub-system. The retry rate can be based on a modified read operation for data that was not successfully corrected by the error control operation. For example, the retry rate can identify a rate at which repeated modified read operations are used to retrieve data in response to unsuccessful error control operations. Any other characteristic that is indicative of the operating life or operating condition of the memory sub-system can be used to puncture the parity bits.

A shown, at operation 254, the processing logic determines that a condition of the memory sub-system has changed. The changing of the condition can be based on the characteristic of the memory sub-system satisfying a threshold condition. For example, the condition of the memory sub-system can be considered to change when the number of write operations that have been performed by the memory sub-system exceeds a particular write count threshold or a threshold condition associated with a threshold number of write counts. In some embodiments, the condition of the memory sub-system can be considered to change when the average bit error rate exceeds a particular bit error rate threshold or when the retry rate for error correction exceeds a particular retry rate threshold. The condition of the memory sub-system can be considered to change as the operating life of the memory sub-system elapses, as the number of write operations that have been performed increases to satisfy a write threshold condition (e.g., meets or exceeds a write threshold number), the average bit error rate increases to satisfy a bit error rate threshold, and/or the retry rate for error correction increases to satisfy a retry rate threshold. The various thresholds can be considered to be satisfied when the corresponding characteristic meets or exceeds the corresponding threshold value.

At operation 255, the processing logic receives additional data to be stored at the memory sub-system. For example, subsequent host data can be received from the host system after the condition of the memory sub-system has changed. At operation 256, the processing logic encodes the additional data to generate another codeword with the number of parity bits. For example, a polar encoding can be performed on the additional data to generate the other codeword that includes the same number of parity bits as the codewords that were generated prior to the condition of the memory sub-system changing. Thus, the same polar encoder can be used to generate the other codeword. At operation 257, the processing logic stores the other codeword with an increased portion of the number of parity bits based on the condition of the memory sub-system changing. For example, the other codeword can be stored with more parity bits than the codeword that was stored prior to the condition of the memory sub-system changing. Thus, fewer parity bits can be punctured or removed relative to the codeword that was stored prior to the condition of the memory sub-system changing. Further details with respect to puncturing parity bits are described in conjunction with FIG. 3B.

As such, codewords can be stored with parity bits based on the condition or characteristic of the memory sub-system. At a first point in the operating life of the memory sub-system, codewords can be stored with a first number of parity bits. A second point in the operating life of the memory sub-system can be detected when a condition of the memory sub-system changes. At the second point in the operating life of the memory sub-system, codewords can be stored with a second number of parity bits that is larger than the first number of parity bits that are stored with codewords at the first point in the operating life of the memory sub-system.

Figure 3A:
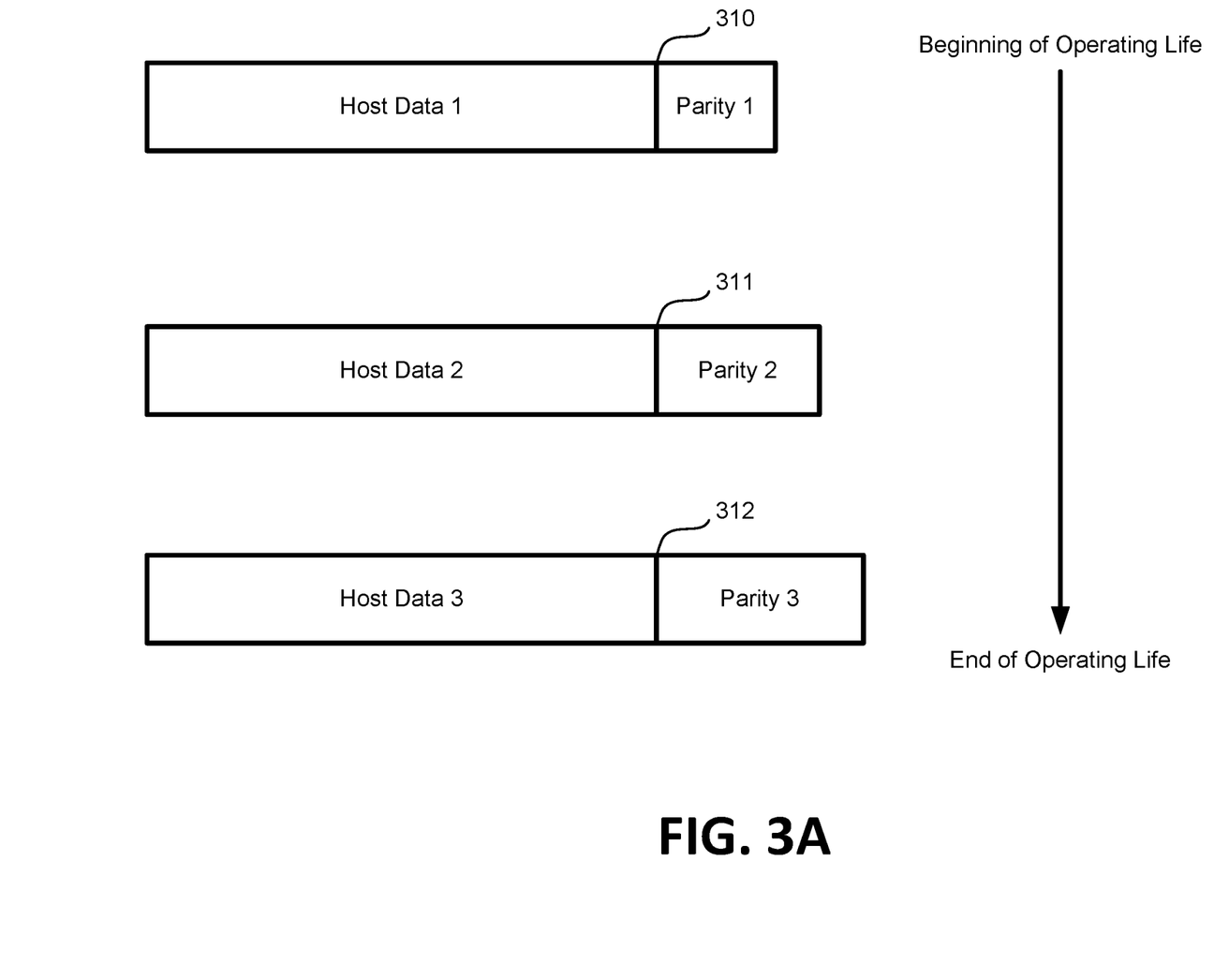
FIG. 3A illustrates the storing of a number of parity bits based on different characteristics indicative of the operating life of the memory sub-system in accordance with some embodiments of the present disclosure.

FIG. 3A illustrates the storing of a number of parity bits based on different characteristics indicative of the operating life of the memory sub-system in accordance with some embodiments of the present disclosure. The storing of the parity bits can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the parity bits are selected to be stored or are punctured by the encoder and decoder component 113 of FIG. 1.

As shown in FIG. 3A, the amount of parity data that is stored for host data can increase as the operating life of the memory sub-system increases. For example, at a first portion of the operating life of the memory sub-system, a codeword 310 can be generated by a polar encoding operation to generate the encoded host data 1 and a number of parity bits. A portion of the number of parity bits of the codeword 310 can be punctured so that parity data 1 is stored in the codeword. Since the parity data 1 is smaller, more of the parity bits from the number of parity bits can be considered to be punctured. Over time, a second portion of the operating life of the memory sub-system can be reached. For example, a particular condition or characteristic of the memory sub-system can satisfy a threshold condition for the second portion of the operating life. Host data 2 can be received and encoded to generate the encoded host data 2 and the same number of parity bits. However, as shown, the portion of the number of parity bits that are stored with the codeword 311 can be increased. For example, fewer parity bits can be punctured relative to the parity bits for the codeword 310. Thus, the size of the parity data for codewords generated during the second portion of the operating life of the memory sub-system can be increased. The increased size of the parity data for the codewords can result in the increased capability of correcting more bits errors of the host data than the codewords with a smaller size of the parity data. Thus, at the later second portion of the operating life of the memory sub-system, the size of the parity data can be increased by puncturing fewer parity bits to allow for increased error correction for the host data as additional errors can be expected when compared to the earlier portion of the operating life of the memory sub-system.

Furthermore, as the operating life of the memory sub-system elapses, the condition or characteristic of the memory sub-system can satisfy another threshold condition for a subsequent third portion of the operating life of the memory sub-system. Host data 3 can be received and encoded to generate the encoded host data 3 and the same number of parity bits by using the polar encoder. However, the portion of the number of parity bits that are stored with the codeword 312 can be increased relative to both the first portion and the second portion of the operating life of the memory sub-system. As shown, the size of the parity data 3 can increase as the operating life of the memory sub-system increases.

Figure 3B:
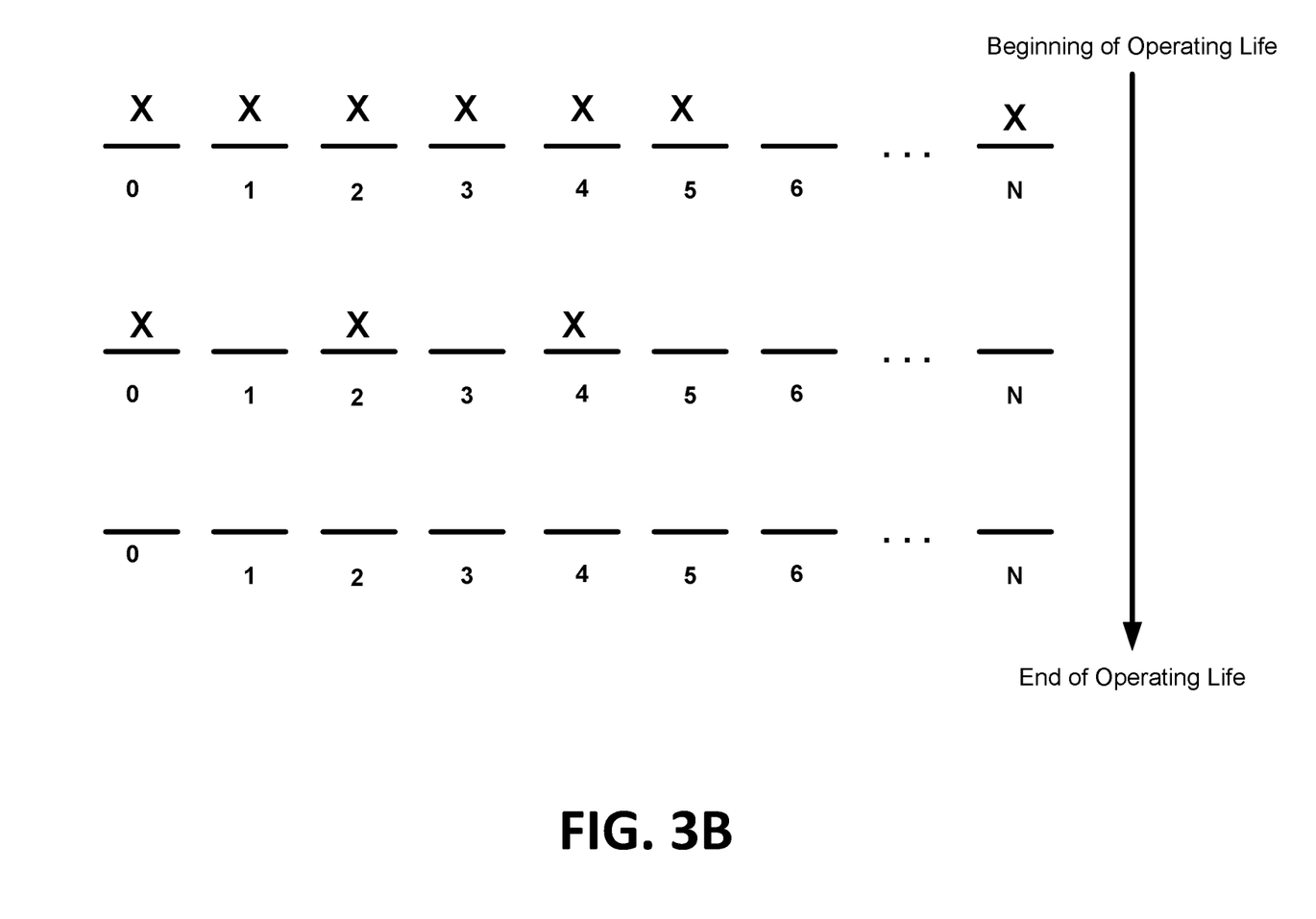
FIG. 3B illustrates the puncturing or storing of a number of parity bits based on different characteristics indicative of the operating life of the memory sub-system increasing in accordance with some embodiments of the present disclosure.

FIG. 3B illustrates the puncturing or storing of a number of parity bits based on different characteristics indicative of the operating life of the memory sub-system increasing in accordance with some embodiments of the present disclosure. The puncturing or storing of the parity bits can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the parity bits are selected to be stored or are punctured by the encoder and decoder component 113 of FIG. 1.

As shown in FIG. 3B, the number of parity bits that are punctured can be decreased over time so that more parity bits are stored with codewords as the operating life of the memory sub-system increases. For example, as shown, a polar encoder can generate a codeword with parity bits 0 through N. For example, 200 parity bits can be generated by the polar encoder when encoding host data. In some embodiments, 100 out of 200 parity bits can be punctured at a first point in the operating life of the memory sub-system. For example, at the initial point of the operating life, the most number of parity bits can be punctured. As the operating life of the memory sub-system increases, fewer parity bits can be punctured or removed. For example, at the middle point of the operating life of the memory sub-system, 50 out of 200 parity bits can be punctured. Subsequently, towards the end of the operating life of the memory sub-system, the least number of parity bits can be punctured. For example, no parity bits can be punctured.

In some embodiments, the puncturing of the bits can be nested between the different portions of the operating life of the memory sub-system. For example, at the first time, particular bit locations of the parity data can be punctured so that parity data at a first subset of bit locations of the parity data are stored and the parity data at a second subset of the bit locations of the parity data are not stored. At a subsequent time when the number of parity bits that are stored increases, the corresponding parity data at the same first subset of bit locations can be stored along with corresponding parity data at a portion of the locations of the second subset of bit locations that were previously punctured. Thus, as the operating life of the memory sub-system increases, the parity data at the bit locations that are punctured can gradually become non-punctured when being stored at the memory sub-system.

The same decoder structure (e.g., same polar decoder) can thus be used throughout the operating life of the memory sub-system as the code rate changes. For example, the same decoder structure or design can be used as the order of parity bits are punctured in a nested scheme. As a result, a different puncturing pattern (e.g., different locations or order of parity bits being punctured) is not utilized by different decoder structures or designs as the code rate changes. Thus, the use of the nested scheme for puncturing parity bits can result in a single structure or design of a decoder, which can further result in less storage resources being utilized by the decoder as multiple different puncturing patterns are not needed to be stored.

Figure 4:
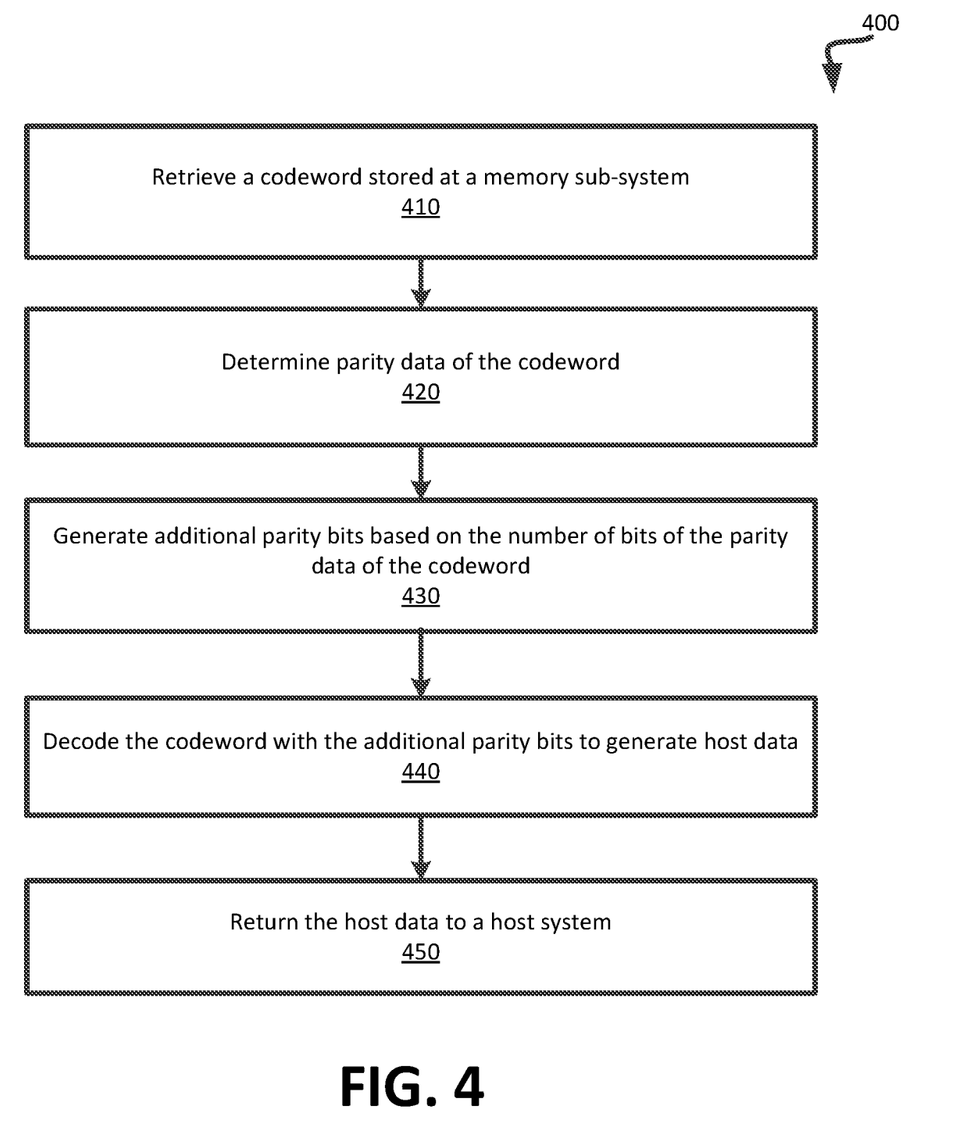
FIG. 4 is a flow diagram of an example method to generate additional parity bits for a codeword based on a number of bits of the parity data of the codeword in accordance with some embodiments of the present disclosure.

FIG. 4 is a flow diagram of an example method 400 to generate additional parity bits for a codeword based on a number of bits of the parity data of the codeword in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the encoder and decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 410, the processing logic retrieves a codeword stored at a memory sub-system. The codeword can be retrieved in response to a read operation from a host system that specifies host data that was previously encoded into the codeword. As previously described, the codeword can include a first portion that corresponds to encoded host data and a second portion that corresponds to a portion of parity bits of the encoded host data. At operation 420, the processing logic determines parity data of the codeword. For example, the portion of the codeword that includes parity bits can be identified. In some embodiments, a predefined or specified portion of the codeword can include the encoded host data and another specified portion can include the parity data. For example, the encoded host data can be located at a defined number of bits at the beginning of the codeword. Any bits after the defined number of bits at the beginning of the codeword can be the parity bits of the parity data that were stored in the codeword after puncturing as previously described.

At operation 430, the processing logic generates additional parity bits based on the number of bits of the parity data of the codeword. For example, the parity bits that were punctured or removed can be reconstructed or generated. In some embodiments, the number of the additional parity bits that are reconstructed can be based on the number of bits of the parity data of the codeword. For example, the number of additional parity bits can be generated so that the number of additional parity bits in combination (i.e., added to) the number of parity bits of the parity data of the retrieved codeword matches the total number of parity bits of parity data that was originally generated for the host data corresponding to the encoded host data of the codeword. In some embodiments, the additional parity bits can be generated based on other bits and the structure of the encoder that is used to encode the data of the codeword. For example, the values of the additional parity bits can be generated or reconstructed during the decoding operation by utilizing values of the other bits (e.g., other bits of the codeword) and any constraints between bits that are utilized by the coding scheme that is used (e.g., the polar code). Further details with respect to reconstructing the parity bits are described in conjunction with FIG. 5A.

As shown in FIG. 4, at operation 440, the processing logic decodes the codeword with the additional parity bits to generate host data. For example, a polar decoder can be used to decode the codeword with the additional parity bits. For example, the combination of the additional parity bits that have been punctured can be combined with parity bits that were not punctured and the bits of the host data and the decoding operation can be performed on the combination of bits and at the same time reconstruct the values of additional parity bits. In some embodiments, if the combination of the bits are successfully decoded, then the additional parity bits can be assumed to have been accurately reconstructed. Otherwise, if the combination of the bits is not successfully decoded, then the additional parity bits may not have been reconstructed correctly. In such cases where the decoding operation was not successful with the reconstructed parity bits, different values for the additional parity bits can be tentatively reconstructed again, and the decoding operation can be performed with the new combination of bits. The polar decoder can perform a decoding of the codeword to generate the host data and the corresponding parity data of the host data. Furthermore, at operation 450, the processing logic returns the host data to a host system. For example, the host data that was decoded from the codeword can be returned to the host system in response to the read request from the host system.

Figure 5A:
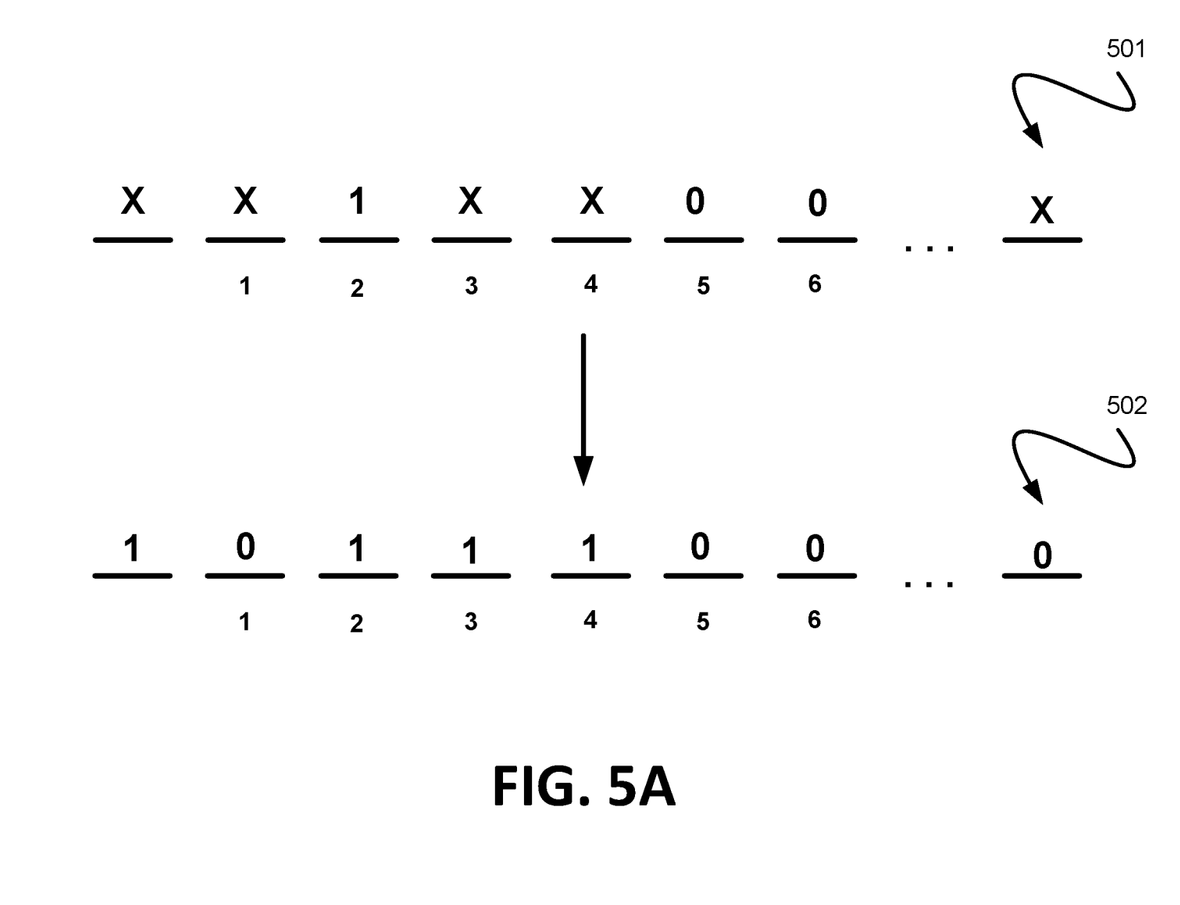
FIG. 5A illustrates the reconstruction of punctured parity bits in accordance with some embodiments of the present disclosure.

FIG. 5A illustrates the reconstruction of punctured parity bits in accordance with some embodiments of the present disclosure. The reconstruction of the punctured parity bits can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the parity bits are reconstructed by the encoder and decoder component 113 of FIG. 1.

As shown in FIG. 5A, the parity data 501 can include a number of parity bits. For example, the locations of the parity data 501 with a '0' or a '1' can represent values of a generated parity data that were not punctured and thus were stored in a codeword as previously described. The locations of the parity data 501 with an 'X' can represent bit locations of the generated parity data that were punctured and thus were not stored in a codeword at the memory sub-system. The codeword with the parity data 501 can be retrieved and the parity bits at the locations with an 'X' can be reconstructed during the decoding by the polar decoder. For example, as shown, the parity data 502 can represent parity data 501 with the reconstructed punctured parity bits. The total number of bits at the parity data 502 can represent the total number of bits that were generated for the parity data by the polar encoder for the corresponding host data of the codeword that included the parity data 501. As such, the parity bits that were punctured can be reconstructed or regenerated to reflect the parity data that was previously generated for the host data by the polar encoder.

Figure 5B:
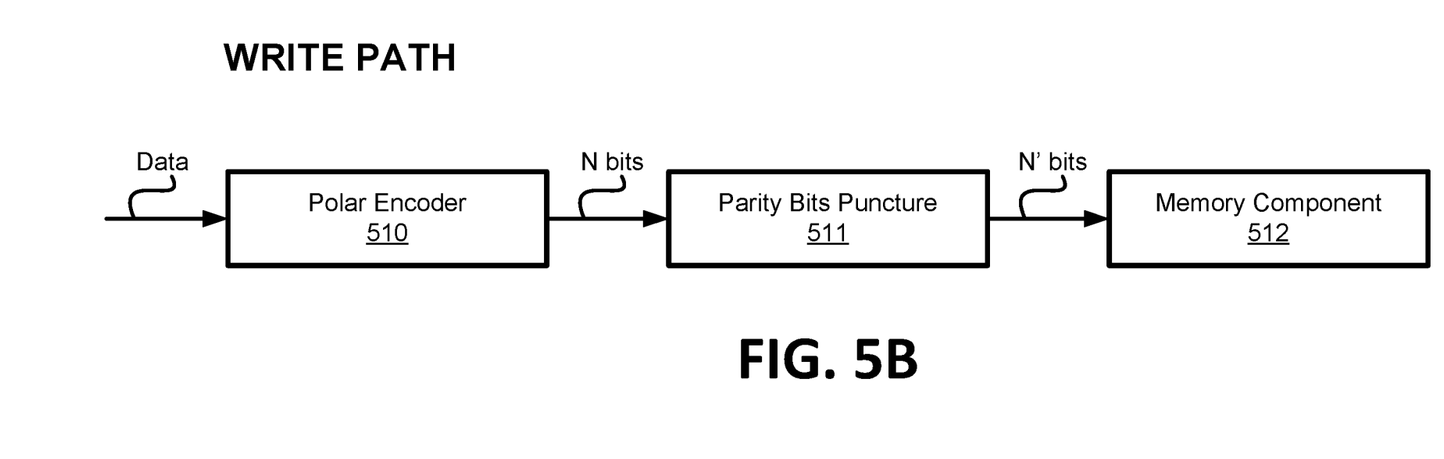
FIG. 5B illustrates a write path to store a codeword in accordance with some embodiments of the present disclosure.

FIG. 5B illustrates a write path to store a codeword in accordance with some embodiments of the present disclosure. The operations of the write path can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations of the write path are performed by the encoder and decoder component 113 of FIG. 1.

As shown in FIG. 5B, host data can be received. In some embodiments, a cyclic redundancy check (CRC) can be performed with the host data to generate the data that is received by the polar encoder 510. The polar encoder 510 can generate the codeword that includes the encoded data and the number of parity bits. The parity bits puncture operation 511 can puncture a portion of the number of parity bits based on a characteristic of the memory sub-system as previously described. Thus, the input to the parity bits puncture operation 511 can be larger than the output of the parity bits puncture operation 511. The output of the polar encoder 510 that has been punctured can then be stored at a memory component 512 of the memory sub-system.

Figure 5C:
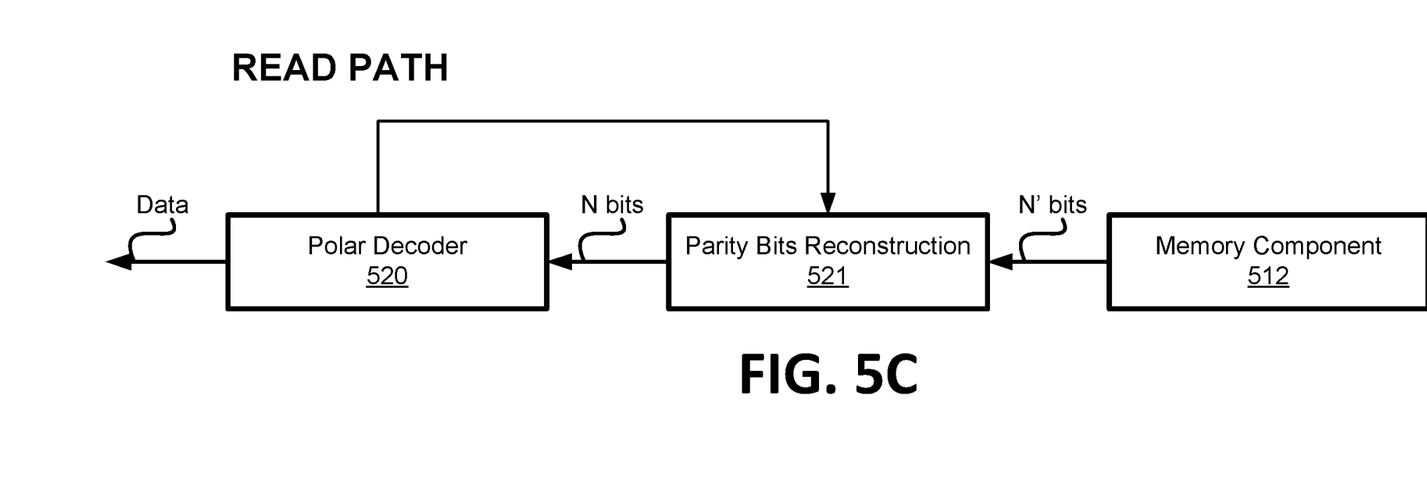
FIG. 5C illustrates a read path to generate data from a codeword in accordance with some embodiments of the present disclosure.

FIG. 5C illustrates a read path to generate data from a codeword in accordance with some embodiments of the present disclosure. The operations of the read path can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations of the read path are performed by the encoder and decoder component 113 of FIG. 1.

As shown in FIG. 5C, the stored codeword with parity bits (e.g., the parity bits that were not punctured or not removed) can be retrieved from the memory component 512. The parity bits reconstruction operation 521 can receive the stored codeword and can reconstruct the punctured parity bits with information of the decoding operation of the polar decoder 520 as previously described. Thus, the input of the parity bits reconstruction operation 521 can be smaller than the output of the parity bits reconstruction operation 521. Subsequently, the codeword with the added parity bits can be decoded by the polar decoder 520 to generate the host data that is to be returned to the host system.

Figure 6:
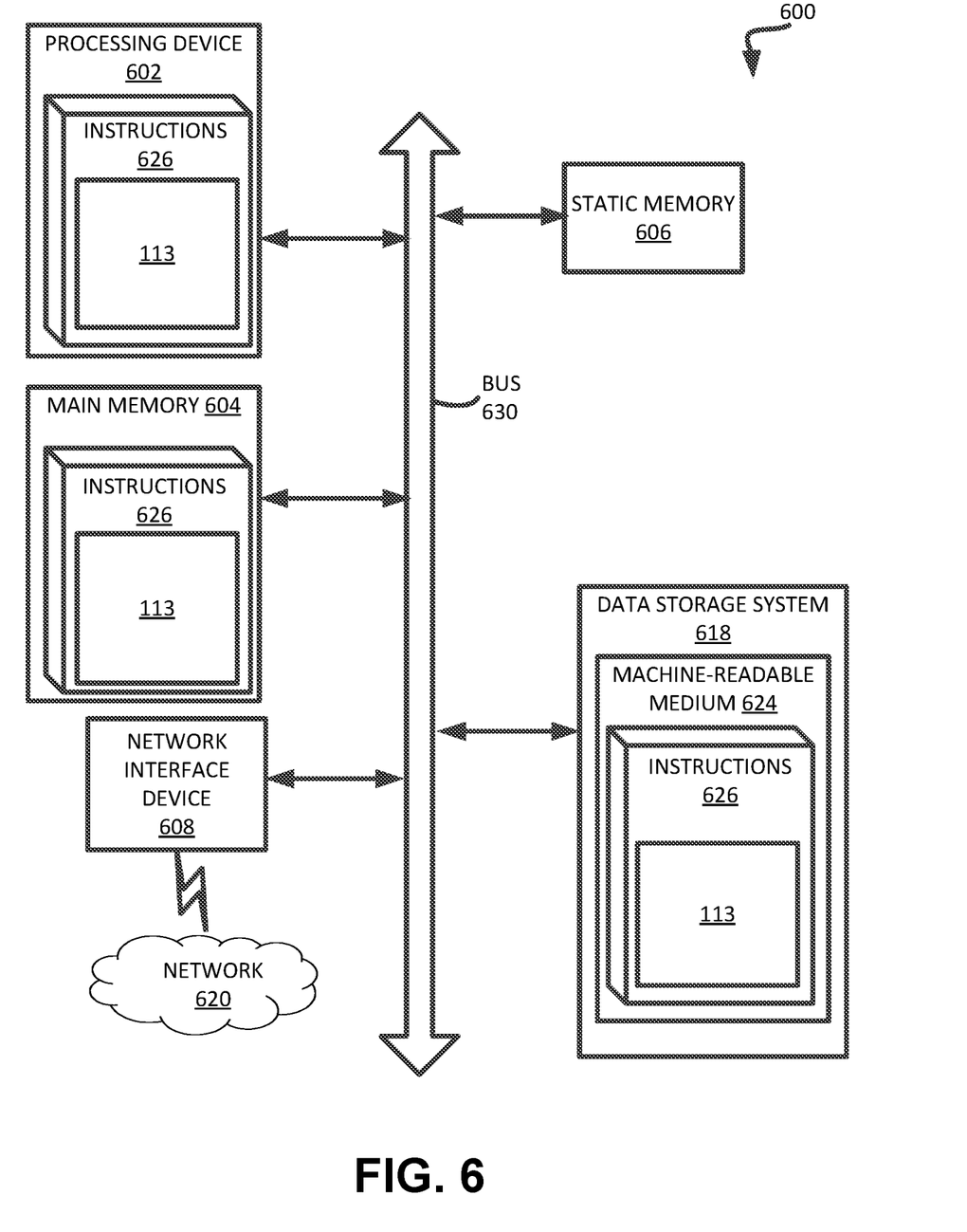
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to encoder and decoder component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an encoder and decoder component (e.g., the encoder and decoder component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving data at a memory sub-system;
   determining a usage characteristic indicative of at least one of an operating parameter, an operating lifetime, or an operating condition of the memory sub-system;
   encoding the received data to generate a codeword with a number of parity bits;
   removing, by a processing device, a portion of the number of parity bits of the generated codeword based on the usage characteristic of the memory sub-system; and
   storing the codeword without the removed portion of the number of parity bits.

2. The method of claim 1, wherein the encoding of the received data to generate the codeword with the number of parity bits is based on a polar encoder.

3. The method of claim 1, wherein the usage characteristic corresponds to a write count of the memory sub-system, and wherein removing the portion of the number of the parity bits comprises:
   determining whether the write count of the memory sub-system satisfies a threshold condition associated with a threshold number of write counts; and
   removing a decreased portion of the number of parity bits of the generated codeword in response to the write count of the memory sub-system satisfying the threshold condition associated with the threshold number of write counts and removing an increased portion of the number of parity bits of the generated codeword in response to the write count of the memory sub-system not satisfying the threshold condition associated with the threshold number of write counts, and wherein the decreased portion includes fewer bits than the increased portion.

4. The method of claim 3, wherein the removing of the decreased portion of the number of parity bits corresponds to the codeword being stored with more parity bits than the codeword being stored without the increased portion of the number of parity bits.

5. The method of claim 1, wherein the usage characteristic corresponds to an operating life of the memory sub-system, and wherein removing the portion of the number of the parity bits comprises:
   determining whether the operating life of the memory sub-system satisfies a threshold condition;
   removing a decreased portion of the number of parity bits of the generated codeword in response to the operating life of the memory sub-system satisfying the threshold condition and removing an increased portion of the number of parity bits of the generated codeword in response to the operating life of the memory sub-system not satisfying the threshold condition, and wherein the decreased portion includes fewer bits than the increased portion.

6. The method of claim 1, further comprising:
   receiving a request from a host system for the data;
   retrieving the codeword stored without the removed portion of the number of parity bits;
   reconstructing the removed portion of the number of parity bits; and
   decoding the codeword with the reconstructed parity bits.

7. The method of claim 6, wherein the decoding of the codeword with the reconstructed parity bits is based on a polar decoder.

8. A system comprising:
   a memory component; and
   a processing device, operatively coupled with the memory component, to:
      receive data to be stored at the system;
      encode the received data to generate a codeword with a number of parity bits;
      remove a portion of the number of parity bits from the codeword;
      store the codeword without the portion of the number of the parity bits;
      determine that a condition associated with the system has changed;
      receive subsequent data to be stored at the system;
      encode the subsequent data to generate another codeword with the number of parity bits;
      remove a decreased portion of the number of the parity bits from the another codeword wherein the decreased portion of the number of parity bits corresponds to fewer parity bits being removed than the portion of the number of the parity bits of the stored codeword; and
      store the another codeword without the decreased portion of the number of the parity bits.

9. The system of claim 8, wherein the encoding of the received data to generate the codeword and the encoding of the subsequent data to generate the another codeword is based on a polar encoder.

10. The system of claim 8, wherein the condition of the memory sub-system changing corresponds to a write count of the memory sub-system satisfying a threshold condition associated with a threshold number of write counts or a bit error condition satisfying another threshold condition associated with a threshold number of bit errors.

11. The system of claim 10, wherein the subsequent codeword is stored with additional parity bits of the number of the parity bits in response to the write count of the memory sub-system increasing.

12. The system of claim 8, wherein the condition of the memory sub-system changing corresponds to an operating life of the memory sub-system satisfying a threshold operating life of the memory sub-system, and wherein the subsequent codeword is stored with additional parity bits of the number of the parity bits in response to the operating life of the memory sub-system increasing.

13. The system of claim 8, wherein the processing device is further to:
 receive a request from a host system for the data;
 retrieve the codeword stored without the portion of the number of the parity bits;
 reconstruct the removed portion of the number of the parity; and
 decoding, by a polar decoder, the codeword with the reconstructed parity bits.

14. A non-transitory computer readable medium comprising instructions, which when executed by a processing device, cause the processing device to perform operations comprising:
 receiving data to be stored at a memory sub-system;
 determining a usage characteristic indicative of at least one of an operating parameter, an operating lifetime, or an operating condition of the memory sub-system;
 encoding the received data to generate a codeword with a number of parity bits;
 removing a portion of the number of parity bits of the generated codeword based on the usage characteristic of the memory sub-system; and
 storing the codeword without the removed portion of the number of parity bits.

15. The non-transitory computer readable medium of claim 14, wherein the encoding of the received data to generate the codeword with the number of parity bits is based on a polar encoder.

16. The non-transitory computer readable medium of claim 14, wherein the usage characteristic corresponds to a write count of the memory sub-system, and wherein to remove the portion of the number of the parity bits, the operations further comprise:
 determining whether the write count of the memory sub-system satisfies a threshold condition associated with a threshold number of write counts; and
 removing a decreased portion of the number of parity bits of the generated codeword in response to the operating life of the memory sub-system satisfying the threshold condition associated with the threshold number of write counts and removing an increased portion of the number of parity bits of the generated codeword in response to the operating life of the memory sub-system not satisfying the threshold condition associated with the threshold number of write counts, and wherein the decreased portion includes fewer bits than the increased portion.

17. The non-transitory computer readable medium of claim 16, wherein the removing of the decreased portion of the number of parity bits corresponds to the codeword being stored with more parity bits than the codeword being stored without the increased portion of the number of parity bits.

18. The non-transitory computer readable medium of claim 14, wherein the usage characteristic corresponds to an operating life of the memory sub-system, and wherein to remove the portion of the number of the parity bits, the operations further comprise:
 determining whether the operating life of the memory sub-system satisfies a threshold condition;
 removing an increased portion of the number of parity bits of the generated codeword in response to the operating life of the memory sub-system satisfying the threshold condition and removing a decreased portion of the number of parity bits of the generated codeword in response to the operating life of the memory sub-system not satisfying the threshold condition, and wherein the decreased portion includes fewer bits than the increased portion.

19. The non-transitory computer readable medium of claim 14, wherein the operations further comprise:
 receiving a request from a host system for the data;
 retrieving the codeword stored without the removed portion of the number of parity bits;
 reconstructing the removed portion of the number of parity bits; and
 decoding the codeword with the reconstructed parity bits.

20. The non-transitory computer readable medium of claim 19, wherein the decoding of the codeword with the reconstructed parity bits is based on a polar decoder.

* * * * *